United States Patent [19]
Kanayama et al.

[11] Patent Number: 5,361,028
[45] Date of Patent: Nov. 1, 1994

[54] METHOD AND APPARATUS FOR HIGH SPEED MAGNETIC RESONANCE IMAGING WITH IMPROVED IMAGE QUALITY

[75] Inventors: Shoichi Kanayama, Saitama; Shigehide Kuhara, Tochigi; Kozo Sato, Kanagawa, all of Japan

[73] Assignee: Kabushiki Kaisha Toshiba, Kawasaki, Japan

[21] Appl. No.: 933,231

[22] Filed: Aug. 21, 1992

[30] Foreign Application Priority Data

Aug. 23, 1991 [JP] Japan .................. 3-211918

[51] Int. Cl.⁵ ............................................. G01V 3/00
[52] U.S. Cl. .................................. 324/309; 324/307
[58] Field of Search ............. 324/300, 306, 307, 309, 324/312, 314

[56] References Cited

U.S. PATENT DOCUMENTS

| | | | |
|---|---|---|---|
| 4,355,282 | 10/1982 | Young et al. | 324/309 |
| 4,740,748 | 4/1988 | Rzedzian | 324/309 |
| 4,901,020 | 2/1990 | Ladebeck et al. | 324/309 |
| 4,982,161 | 1/1991 | Twieg | 324/309 |
| 5,043,665 | 8/1991 | Kuhara et al. | 324/309 |

FOREIGN PATENT DOCUMENTS

| | | |
|---|---|---|
| 0372814 | 6/1990 | European Pat. Off. |
| 0418675 | 3/1991 | European Pat. Off. |
| 0490528 | 6/1992 | European Pat. Off. |
| 4035410 | 6/1991 | Germany |
| WO91/02263 | 2/1991 | WIPO |

OTHER PUBLICATIONS

J. Hennig, et al., Magnetic Resonance in Medicine 3, 1986, pp. 823–833. "RARE Imaging" (month of pub. unknown).

K. Oshio, et al., Magnetic Resonance in Medicine 20, 1991, pp. 344–349. "GRASE Imaging" (month of pub. unknown).

*Primary Examiner*—Louis Arana
*Attorney, Agent, or Firm*—Oblon, Spivak, McClelland, Maier & Neustadt

[57] ABSTRACT

A nuclear magnetic resonance imaging method and apparatus, capable of obtaining images with high spatial resolution arid S/N ratio, reducing the influence of the inhomogeneity of the static magnetic field and the chemical shift artifacts, and improving the contrast in the $T_2$ enhanced image and $T_1$ enhanced image. The imaging uses the pulse sequence, including: application of RF pulses and slicing gradient magnetic field for exciting a desired region of the body to be examined; application of reading gradient magnetic fields which regularly fluctuate between a negative value and a positive value; application of initial phase encoding gradient magnetic field before the reading gradient magnetic field is applied; application of a predetermined pulse shaped phase encoding gradient magnetic field every time the reading gradient magnetic field changes polarity; and collection of the echo signals emitted from the desired region every time the reading gradient magnetic field changes polarity. This pulse sequence is repeated while sequentially changing a setting of the initial phase encoding gradient magnetic field applied.

28 Claims, 14 Drawing Sheets

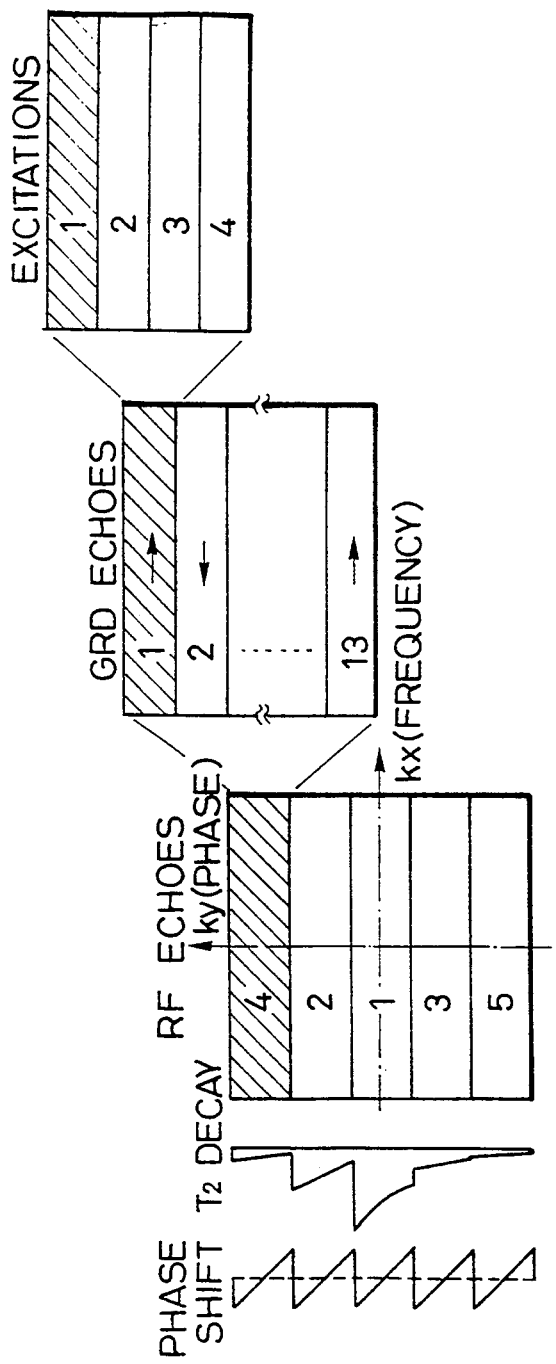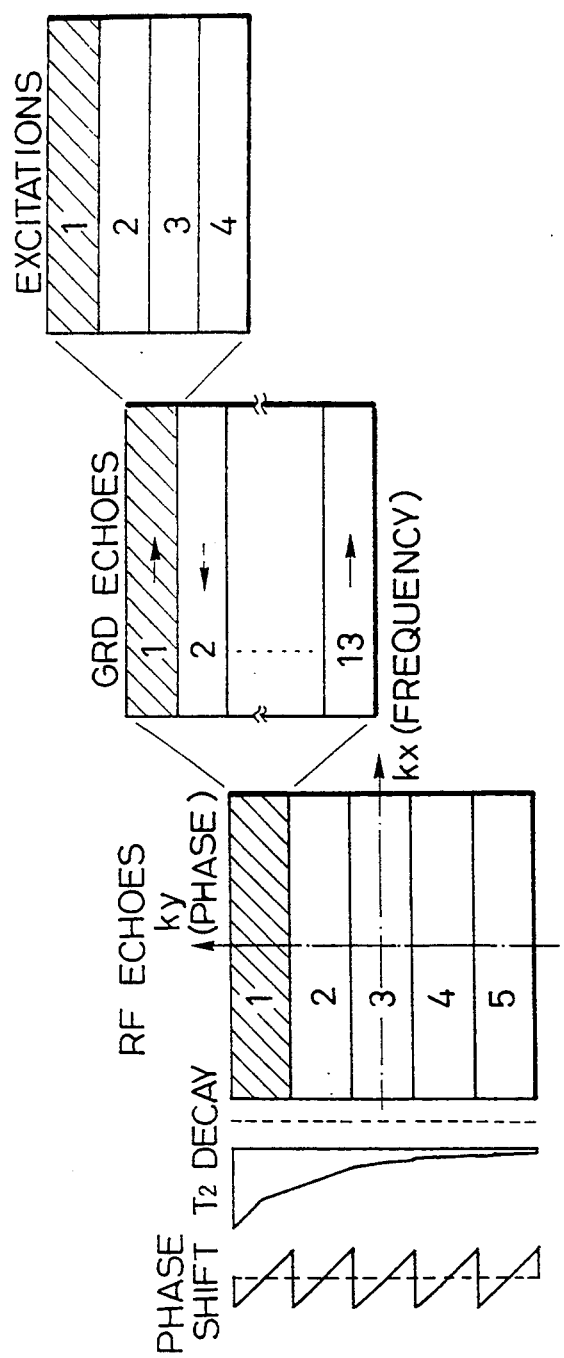
FIG. 5A
FIG. 5B

METHOD AND APPARATUS FOR HIGH SPEED MAGNETIC RESONANCE IMAGING WITH IMPROVED IMAGE QUALITY

BACKGROUND OF THE INVENTION

1. Field of the Invention

The present invention relates to a high speed magnetic resonance (MR) imaging, and more particularly, to the improvement of the image quality such as a spatial resolution and an S/N ratio in such a high speed magnetic resonance imaging.

2. Description of the Background Art

As is well known, the magnetic resonance imaging is a method for visualizing microscopic chemical and physical information of an object to be examined by utilizing the phenomenon that a group of nuclear spins having characteristic magnetic moments, located within a homogeneous static magnetic field, causes a resonant absorption of the energy of the high frequency magnetic field rotating at the specific frequency around the object to be examined.

There are several conventionally known methods for visualizing the spatial distribution of the specific atomic nuclei such as hydrogen nuclei in water and fat in the body to be examined by utilizing this nuclear magnetic resonance (NMR) phenomenon, including the NMR zeugmatography invented by Lauterbur, the NMR 2D Fourier transform zeugmatography invented by Kumar, Welti, Ernst, and others, and the spin warp MR imaging invented by Hutchison and others.

In these conventionally known MR imaging methods, there is a need to collect the NMR signals necessary in the image reconstruction by applying the high frequency magnetic field (RF pulse) and gradient magnetic fields on, no the body to be examined repeatedly according to a predetermined pulse sequence, that it takes a considerable amount of imaging time for completing the imaging process.

For this reason, in the case of imaging a dynamic imaging target such as a heart whose position and shape are varying in time, unless a special method such as a heart beat synchronization is used, blurs or the artifacts on the image are inevitable due to the movement of the imaging target. On the other hand, when the heart beat synchronization is used, the imaging time becomes even longer, so that the imaging target to which the heart beat synchronization is applicable is rather limited. Similar problems can also be caused by the body movement due to respiration in the case of abdominal imaging.

There are several propositions for the high speed imaging methods to overcome these difficulties of the conventional MR imaging methods, including FLASH imaging proposed by Haase and others (see, Journal of Magnetic Resonance, Vol. 67, pp. 258-266 (1986)) and its variations, the echo planar imaging proposed by Mansfield (see, U.S. Pat. No. 4,165,479), and the ultrafast Fourier imaging (see, U.S. Pat. No. 4,451,788). In these high speed imaging methods, the imaging time for completing the imaging process can be as short as 50 ms to 10 sec.

However, these conventionally known high speed imaging methods have the drawback that the spatial resolution and the S/N ratio in the obtained images are rather low, that they are easily influenced by the inhomogeneity of the static magnetic field, and that the chemical shift artifacts are easily caused in the obtained images.

In addition, the conventional high speed imaging methods such as FLASH imaging have the further shortcoming in that the contrast becomes poor in the $T_2$ enhanced image, $T_1$ enhanced image, and spin density image, which can be obtained by using the conventionally known spin echo pulse sequence.

There are several propositions to overcome these problems of the conventional high speed MR imaging methods, including the mosaic scan imaging method ( see, U.S. Pat. No. 4,767,991), the hybrid imaging method combining the ultra-fast Fourier imaging with the spin warp imaging (see, U.S. Pat. No. 4,355,282 and U.S. Pat. No. 4,607,223), the RARE imaging proposed by Henning and others (See. Magnetic Resonance in Medicine, Vol. 3, pp. 823-833, (1986)), and the hybrid imaging method combining the ultrafast Fourier imaging with either the CPMG (Carr-Purcell-Meiboom-Gill) scheme or the modified CP (Carr-Puncell) scheme (see, U.S. Pat. No. 4,746,864).

However, in the RARE imaging, for example, a very large number of 180° RF pulses must be applied to the imaging target, so that there arises the problem off temperature increase where the imaging target is a human body, and an imaging time of several seconds to several tens of seconds is required.

In addition, the mosaic scan imaging method and the hybrid imaging method are unable to resolve the problems of the influence of the inhomogeneity of the static magnetic field, the chemical shift artifacts, and the poor contrast in the $T_2$ enhanced image, $T_1$ enhanced image, and spin density image.

SUMMARY OF THE INVENTION

It is therefore an object of the present invention to provide a method and an apparatus for magnetic resonance imaging, capable of obtaining the images with high spatial resolution and S/N ratio.

It is another object of the present invention to provide a method and an apparatus for magnetic resonance imaging, capable of reducing the influence of the. inhomogeneity of the static magnetic field.

It is another object of the present invention to provide a method and an apparatus for magnetic resonance imaging, capable of reducing the chemical shift artifacts.

It is another object of the present invention to provide a method and an apparatus for magnetic resonance imaging, capable of improving the contrast in the $T_2$ enhanced image and $T_1$ enhanced image.

According to one aspect of the present invent lion there is provided a method of magnetic resonance imaging, comprising the steps of: (a) placing an object to be examined in a static magnetic field; (b) carrying out a pulse sequence, including: (b1) applying RF pulses and slicing gradient magnetic field for exciting a desired imaging region in the body to be examined; (b2) applying reading gradient magnetic field which regularly fluctuates between a negative value and a positive value onto the body to be examined; (b3) applying initial phase encoding gradient magnetic field for specifying a partial region in a k-space, onto the body to be examined before the reading gradient magnetic field is applied in step (b3); (b4) applying a predetermined pulse shaped phase encoding gradient magnetic field onto the body to be examined, every time the reading gradient magnetic field changes polarity; and (b5) collecting echo signals for the, region in the k-space emitted from the desired imaging region, every time the reading gradient magnetic field changes the polarity; (c) repeating the pulse sequence of the step (b) for a plurality of times, with sequentially changing a setting of the initial phase encoding gradient magnetic field applied at the step (b3), such that the signals are collected for an entire region of the k-space; and (d) reconstructing MR images from the echo signals for the entire region of the k-space collected in step (b5) by a repeated application of the pulse sequence of stem (b).

According to another aspect of the present invention there is provided an apparatus for magnetic resonance imaging, comprising: means for producing a static; magnetic field in which a body to be examined is to be placed, pulse sequence execution means for carrying out a pulse sequence including: first means for applying RF pulses and a slicing gradient magnetic field for exciting a desired imaging region in the body to be examined; second means for applying a reading gradient magnetic field which regularly fluctuates between a negative value and a positive value onto the body to be examined; third means for applying initial phase encoding gradient magnetic field specifying a partial region in a k-space, onto the body to be examined before the reading gradient magnetic field is applied by the second means, and applying a predetermined pulse shaped phase encoding gradient magnetic field onto the body to be examined, every time the reading gradient magnetic field changes a polarity; and data acquisition means for collecting echo signals for the partial region in the k-space emitted From the desired imaging region, every time the reading gradient: magnetic field changes polarity; control means for controlling the pulse sequence execution means to repeat the pulse sequence by the first, second, and third means and the data acquisition means for a plurality of times, while sequentially changing a setting of the initial phase encoding gradient magnetic field applied by the third means, such that the echo signals are collected for an entire region of the k-space; and image reconstruction means for reconstructing MR images from the echo signals for the entire region of the k-space collected by the data acquisition means by a repeated application the pulse sequence by the pulse sequence execution means.

Other features and advantages of the present invention will become apparent from the following description taken in conjunction with the accompanying drawings.

BRIEF DESCRIPTION OF THE DRAWINGS

FIGS. 5A and 5B are diagrammatic illustrations of two possible k-space segmentation pattern that can be used in the first embodiment using the pulse sequence of FIG. 2.

DETAILED DESCRIPTION OF THE PREFERRED EMBODIMENTS

Figure 1:
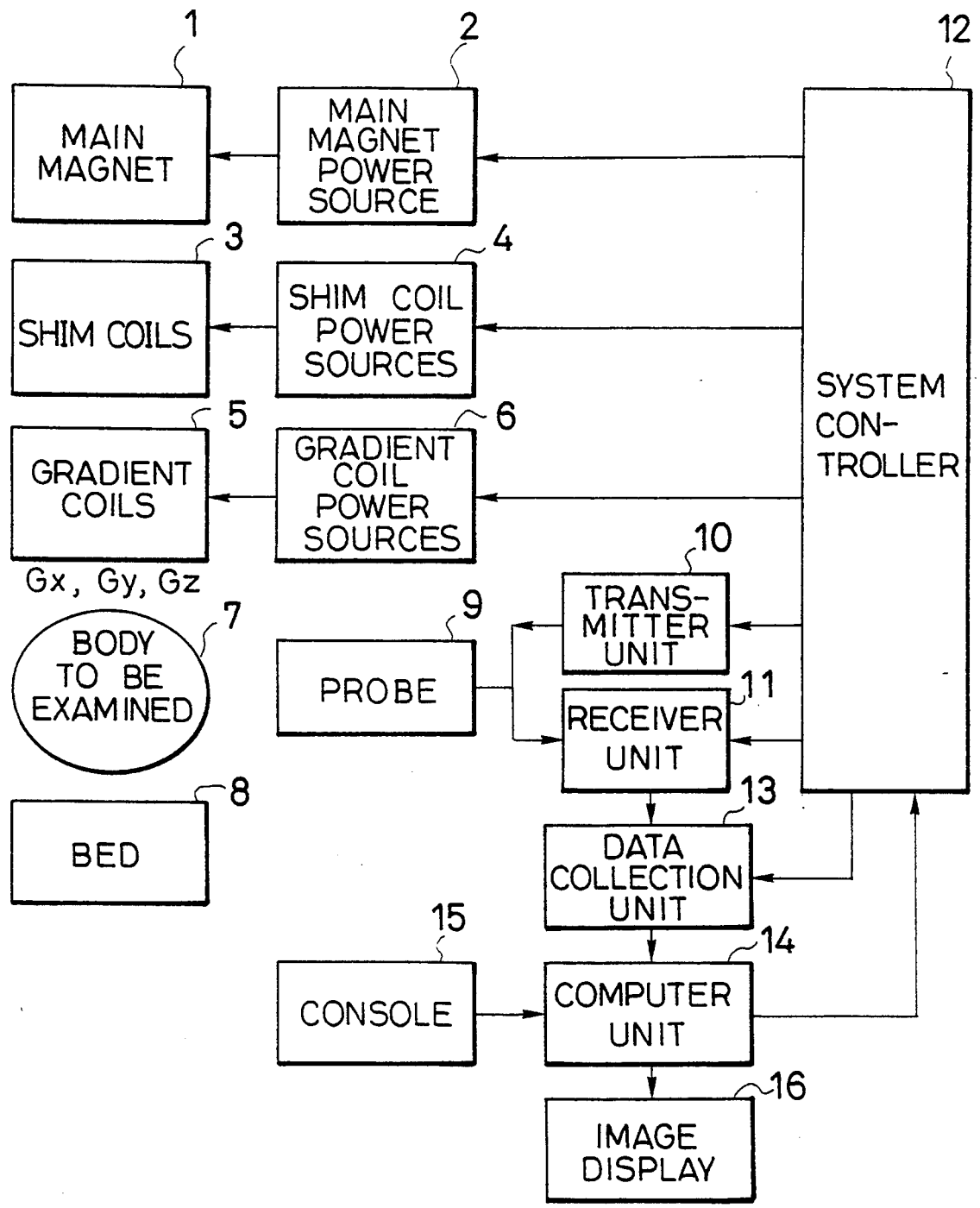
FIG. 1 is block diagram of one embodiment of a magnetic resonance imaging apparatus for implementing the method of magnetic resonance imaging according to the present invention.

Referring now to FIG. 1, one embodiment of a magnetic resonance (MR) imaging apparatus for implementing the method of magnetic resonance imaging according to the present invention will be described in detail.

In this embodiment, the magnetic resonance imaging apparatus comprises: a main magnet 1 for producing a static magnetic field; a main magnet power source 2 for supplying power to the main magnet: 1; shim coils 8 for adjusting the homogeneity of the static magnetic field produced by the main magnet 1; shim coil power sources 4 for supplying power to the shim coil 3; gradient coils 5 for producing gradient magnetic fields in X-, Y-, and Z-directions: gradient coil power sources 6 for supplying power to the gradient coils 6; a bed 8 for mounting a body to be examined 7 in the static magnetic field produced by the main magnet 1 and the gradient magnetic fields produced by the gradient coils 5; a probe 9 for transmitting RF pulses onto the body to be examined 7 and receiving nuclear magnetic resonance (NMR) signals emitted from the body to be examined 7; a transmitter unit 10 for supplying the pulses to be transmitted from the probe 9; a receiver unit 11 for applying the orthogonal phase detection to the signals received by the probe 9 to obtain MR image data; a data collection unit 13 for collecting and A/D converting the MR image data obtained by the receiver unit 11; a computer unit 14 for processing the MR image data collected and A/D converted by the data collection unit 13 to reconstruct MR images; a console 15 for allowing an operator to control the computer unit 14; an image display 16 for displaying MR images reconstructed by the computer unit 14; and a system controller 12 for coordinating the operations of the elements described above, according to the commands from the operator entered at the console This magnetic resonance imaging apparatus can be operated under the appropriate coordination by the system controller 12 to implement the various embodiments of the method of magnetic resonance imaging according to the present invention by carrying out the various pulse sequences, each of which will now be described in detail. In the following description, in the figures showing the various pulse sequences, RF stands for the RF pulses, Gs, Gr, and Ge stand for the gradient magnetic fields used for slicing of desired imaging slice plane in the body to be examined 7, reading of the NMR signals from the body to be examined 7, and encoding of position information in the imaging slice plane as phase information in the signals, respectively, Referring now to FIG. 2, the pulse sequence implementing the first embodiment of the method of magnetic resonance imaging according to the present invention will be described in detail.

Figure 2:
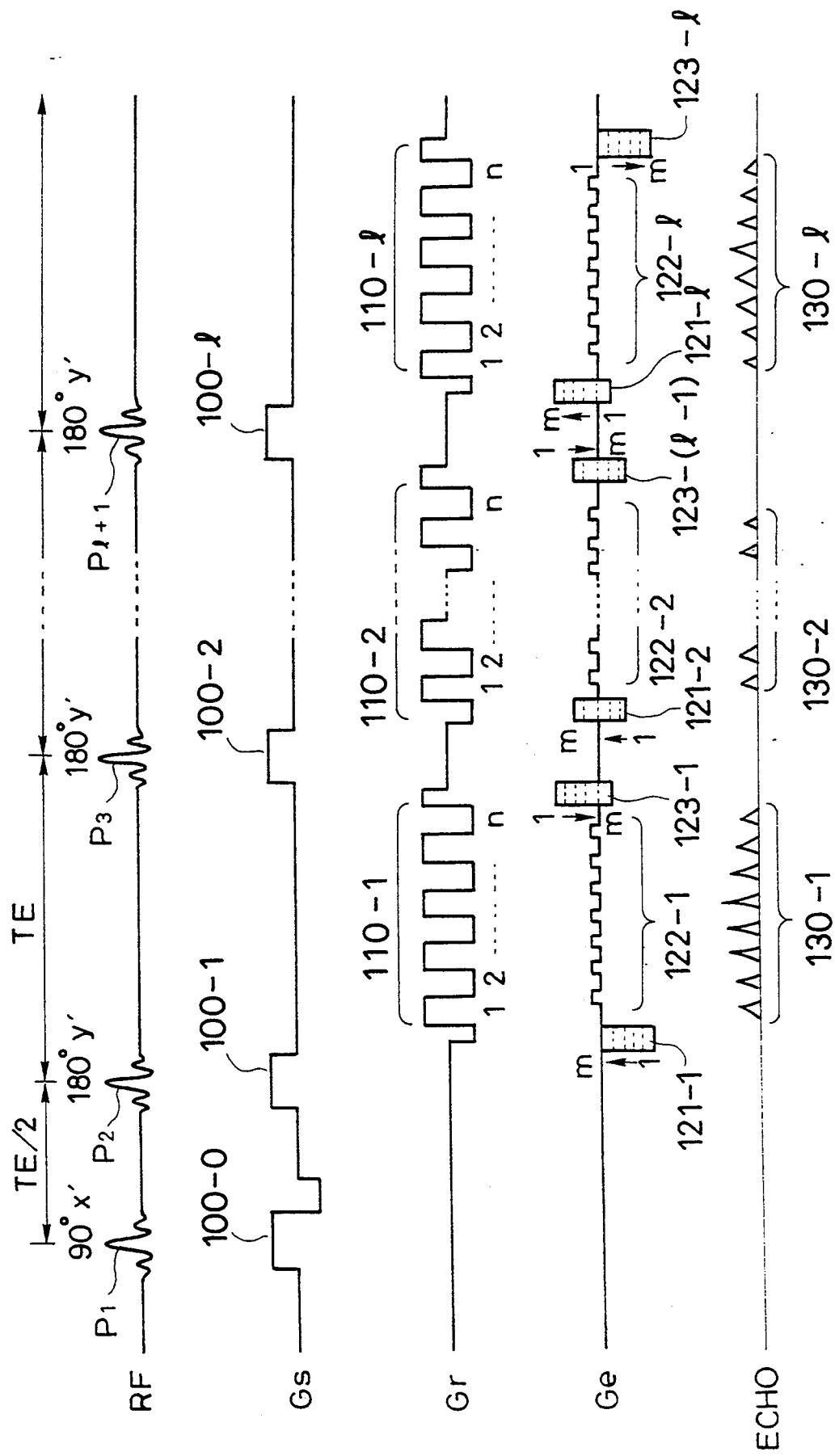
FIG. 2 is a timing chart for the pulse sequence according to the first embodiment of the method of magnetic resonance imaging according to the present invention.

In the pulse sequence of FIG. 2, first the 90° RF pulse $P_1$ pointing in the x'-direction in the rotational coordinates is applied from the probe 9, while the slicing gradient magnetic field 100-0 is applied by the gradient coils 5.

Then, the first 180° RF pulse $P_2$ pointing in the y'-direction in the rotational coordinates is applied from the probe 9 after an elapse of time TE/2 from a center of the 90° RF pulse $P_1$, where TE is an echo time, while the slicing gradient magnetic field 100-1 is applied by the gradient coils 5. By this first 180° RF pulse $P_2$, the varying phases of the nuclear spins produced by the inhomogeneity of the static magnetic field or the static magnetic field off-set are inverted with respect to the y'-axis of the rotational coordinates, such that the echo signals are produced after an elapse of TE/2 from the center of the first 180° RF pulse $P_2$ as the phases of the nuclear spins get aligned.

Then, the first m-step initial phase encoding gradient magnetic field 121-1 is applied from the gradient coils 5, and the first series of the reading gradient magnetic field 110-1 which is regularly fluctuating between positive value and negative value for n times is applied by the gradient coils 5, while at the same time the first series of pulse shaped phase encoding gradient magnetic field 122-1 is applied during the switching intervals in response to the application of the first series of the reading gradient magnetic field 110-1, so as to collect the echo signal data sequence given by the echo signals 130-1.

After the echo signal data sequence is collected during a period of TE from the center of the first 180° RF pulse $P_2$, the first rewinding phase encoding gradient magnetic field 123-1 for making the integrated value of the phase encoding gradient magnetic fields equal to zero or a predetermined constant value is applied, so as to rewind the phases of the gradient magnetic fields to the initial state.

Figure 3:
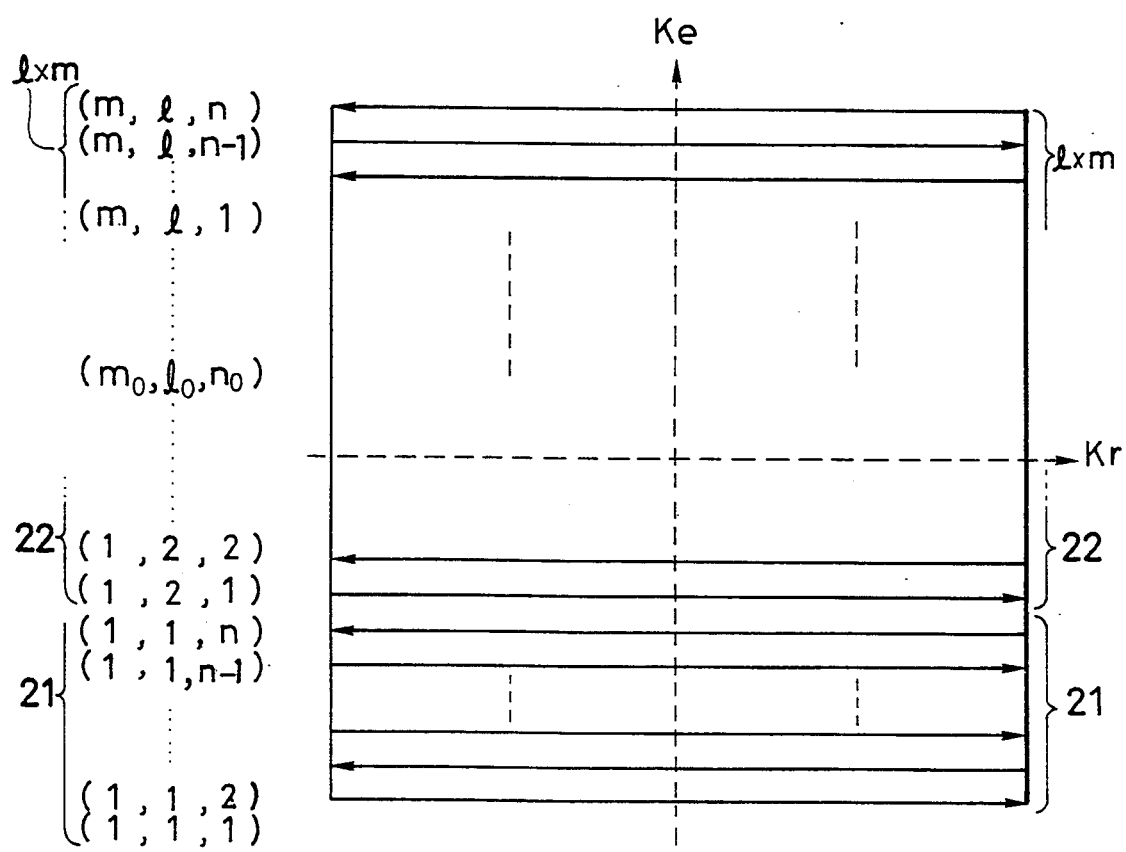
FIG. 3 is a diagram of the k-space trajectory for indicating an order of data acquisition in the first embodiment using the pulse sequence of FIG. 2.

With the process up to this point, the data for the first region 21 in the k-space shown in FIG. 3 can be collected.

Next, after an elapse of TE from the center of the 180° pulse $P_2$, the second 180° RF pulse $P_3$ pointing in the y'-direction in the rotational coordinates is applied from the probe 9, while the slicing gradient magnetic field 100-2 is applied by the gradient coils 5.

Then, the second m-step initial phase encoding gradient magnetic field 121-2 is applied from the gradient coils 5, and the second series of the reading gradient magnetic field 110-2 which is regularly fluctuating between positive value and negative value for n times is applied by the gradient coils 5, while at the same time the second series of the pulse shaped phase encoding gradient magnetic field 122-2 is applied during the switching intervals in response to the application of the second series of the reading gradient magnetic field 110-2, so as to collect the echo signal data sequence given by the echo signals 130-2. Here, the second initial phase encoding gradient magnetic field 121-2 has the value different from that of the first initial phase encoding gradient magnetic field 121-1 used in obtaining the data for the first region 21 in the k-space.

After the echo signal data sequence is collected during a period of TE from the center of the second 180° RF pulse $P_3$, the second rewinding phase encoding gradient magnetic field 123-2 for making the integrated value of the phase encoding gradient magnetic fields equal to zero or a predetermined constant value is applied, so as to rewind the phases of the gradient magnetic fields to the initial state. Here, the second rewinding phase encoding gradient magnetic field 123-2 has a value different from that of the first rewinding phase encoding gradient magnetic field 123-1 used in obtaining the data for the first region 21 in the k-space, in correspondence to the difference between the second initial phase encoding gradient magnetic field 121-2 and the first initial phase encoding gradient magnetic field 121-1.

With the process since the application of the second 180° RF pulse $P_2$ up to this point, the data for the second region 22 in the k-space shown in FIG. 3 can be collected.

Thereafter, the process similar to that described above for obtaining the data for the second region 22 in the k-space is repeated up to the L-th echo signal data sequence given by the echo signals 130-L. Here, the values of the initial phase encoding gradient magnetic field 121 and the corresponding rewinding phase encoding gradient magnetic field 123 for obtaining each echo signal data sequence are set to be different from the values used for the previous echo signal data sequences, as shown in FIG. 2.

Then, the entire pulse sequence of FIG. 2 as described above is repeated for m times, with the values of the initial phase encoding gradient magnetic field 121 and the corresponding rewinding phase encoding gradient magnetic field 123 for obtaining each of the first to L-th echo signal data sequence sequentially changed among m different settings, so as to obtain the data for the subsequent regions in the k-space. In other words, the process similar to that described above for obtaining one block of echo signals by using a series of the reading gradient magnetic field and a series of phase encoding gradient magnetic field is repeated for l×m times in order to obtain all the data in all the regions in the k-space.

After all the data in all the regions in the k-space are obtained, the desired MR image can be obtained by rearranging the data in the k-space according to the data acquisition pattern specified by the initial phase encoding gradient magnetic field 121, and applying the inverse 2D Fourier transformation to the rearranged data.

In this first embodiment, the k-space is divided into a plurality of regions and the data are collected for each of the regions in the k-space separately, so that the image quality of the obtained MR image such as the spatial resolution and the S/N ratio can be improved, as the echo signals having less dissipation are used in obtaining the data for each of the regions in the k-space.

It is to be noted that, although in the pulse sequence shown in FIG. 2, the initial phase encoding gradient magnetic field 121 is gradually increased step by step from the process for obtaining the data for the first region in the k-space onward, the pattern of changing of the initial phase encoding gradient magnetic field 121 may be different from such a pattern shown in FIG. 2, and any desirable pattern can be used according to the need.

It is also to be noted that the influence due to the inhomogeneity of the static magnetic field is minimum at a point after an elapse of TE/2 since the application of each 180° RF pulse, so that the image quality of the obtained MR image can be further improved by appropriately adjusting the data acquisition pattern specified by the initial phase encoding gradient magnetic field 121 such that the data obtained after an elapse of TE/2 since the application of each 180° RF pulse are located in a vicinity of the origin on the k-space.

Figure 4A:
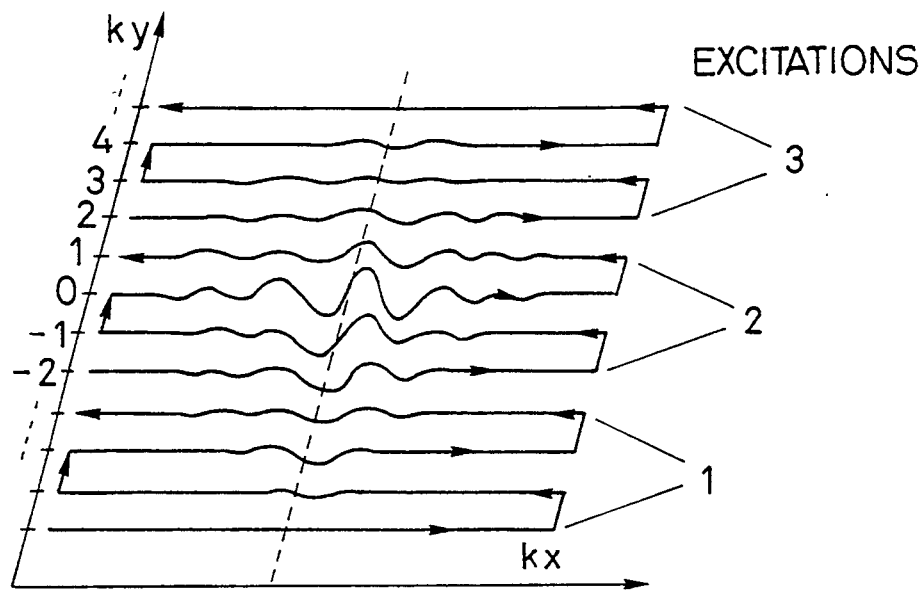
FIGS. 4A and 4B are diagrammatic illustrations of two possible data acquisition pattern that can be used in the first embodiment using the pulse sequence of FIG. 2.
Figure 4B:
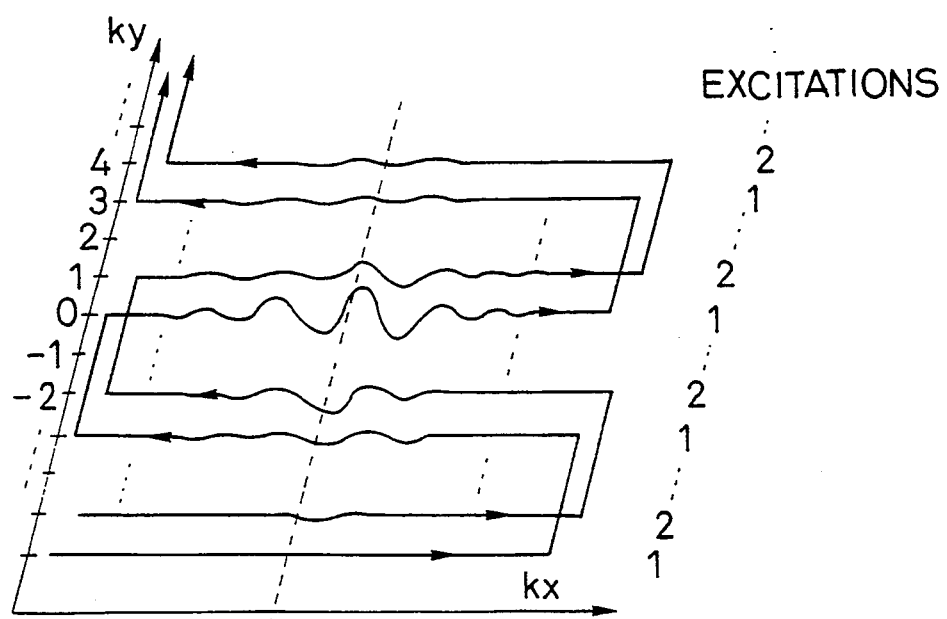

It is further to be noted that, although the order of data acquisition realized in the k-space shown in FIG. 3 indicates the data acquisitions to proceed along a zigzag trajectory in the k-space as shown in FIG. 4A, the data acquisition may be carried out to proceed along an interlaced trajectory in the k-space as shown in FIG. 4B alternatively.

It is to be noted in addition that, although the CPMG (Carr-Purcell-Meiboom-Gill) RF pulse sequence of 90°(x')→180°(y')→180°(y')→ is used for the RF pulses in the pulse sequence shown in FIG. 2, the other pulse sequence for the RF pulses such as modified CP (Cart-Purcell) RF pulse sequence of 90°(x')→180°(x')→180°(x')→ or any other desired RF pulse sequence may be used instead.

It is to be noted moreover that the data acquisition procedure for obtaining all the data on the k-space as described above may be replaced by the so called half encoding scheme in which the data are obtained for only half of the k-space and the remaining half of the data are derived as the complex conjugates of the obtained data. Using such a half encoding scheme, the imaging time can be reduced in half.

Moreover, by setting the repetition interval of the entire pulse sequence (i.e., a period between the application of the 90° RF pulse for one pulse sequence to the application of the 90° RF pulse for another pulse sequence) to be sufficiently longer than the longitudinal relaxation time T1 of the nuclear spins, and by adjusting the initial phase encoding gradient magnetic field so as to realize the pattern of the segmentation of the k-space as shown in FIG. 5A in which the data reflecting the transverse relaxation time T2 of the nuclear spins are located in a vicinity of the origin on the k-space, instead of using the pattern of the segmentation of the k-space as shown in FIG. 5B which corresponds to the order of data acquisitions indicated in FIG. 3, it becomes possible to obtain the T2 enhanced image of the body to be examined 7 with improved contrast.

Figure 6:
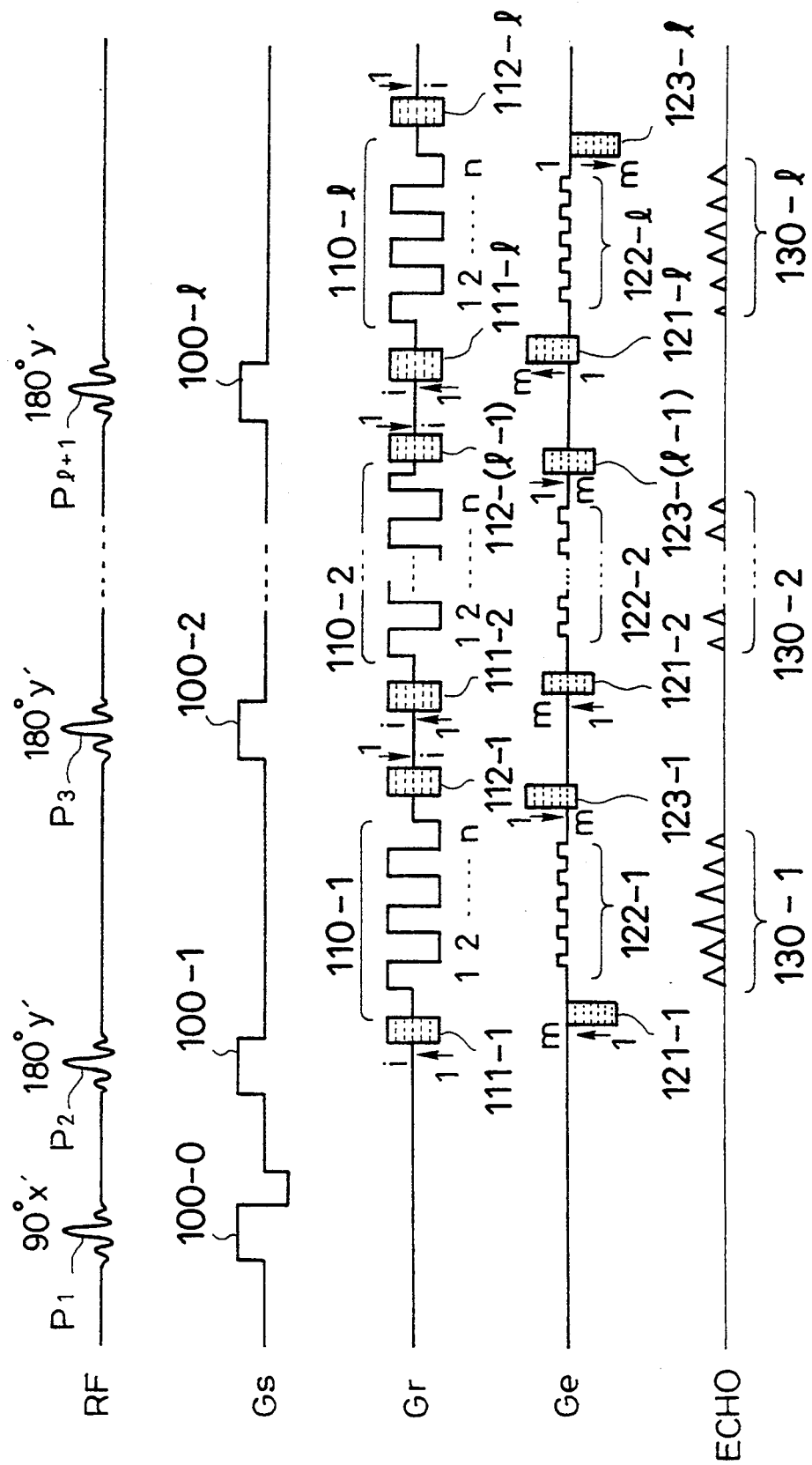
FIG. 6 is a timing chart for the pulse sequence according to the second embodiment of the method of magnetic resonance imaging according to the present invention.

Referring now to FIG. 6, the pulse sequence implementing the second embodiment of the method of magnetic resonance imaging according to the present invention will be described in detail.

This pulse sequence of FIG. 6 differs from the pulse sequence of FIG. 2 in that, prior to the application of the reading gradient magnetic field 110, i-step off-set reading gradient magnetic field 111 is also applied, and after the application of the reading gradient magnetic field 110, i-step off-set cancelling gradient magnetic field 112 is also applied. The remaining features of this pulse sequence of FIG. 6 are substantially similar to those of FIG. 2.

In this second embodiment, the entire pulse sequence of FIG. 6 is repeated for m×i times, with the values of the initial phase encoding gradient magnetic field 121 and the corresponding rewinding phase encoding gradient magnetic field 123 for obtaining each of the first to l-th echo signal data sequence sequentially changed among m different settings, and the values of the off-set reading gradient magnetic field 112 and the off-set cancelling gradient magnetic field 112 for obtaining each of the first to l-th echo signal data sequence sequentially changed among i different settings, so as to obtain the data for the subsequent regions in the k-space.

Figure 7:
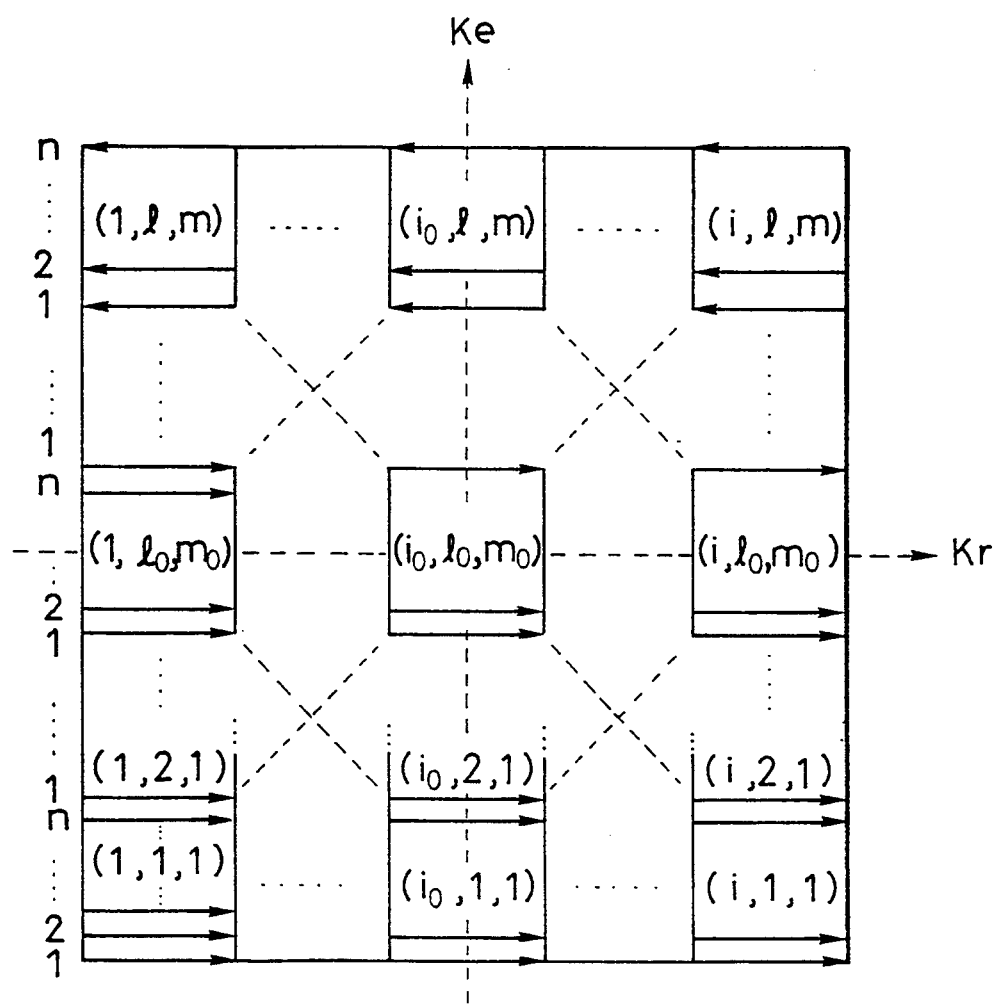
FIG. 7 is a diagram of the k-space trajectory for indicating an order of data acquisition in the second embodiment using the pulse sequence of FIG. 6.

With such an incorporation of the off-set reading gradient magnetic field 111 and the corresponding off-set cancelling gradient magnetic field 112, the data acquisition using this pulse sequence of FIG. 6 proceeds in units of blocks in both the encoding and reading gradient magnetic field directions on the k-space, as indicated in FIG. 7.

In this second embodiment, the k-space is more finely divided into a plurality of blocks and the data are collected for each of the blocks in the k-space separately. so that the image quality of the obtained NMR image such as the spatial resolution and the S/N ratio can be even more improved compared with the first embodiment described above, as the echo signals having even less dissipation are used in obtaining the data for each of the blocks in the k-space.

It is to be noted that the various modifications such as those noted above for the first embodiment are also applicable to this second embodiment.

Figure 8:
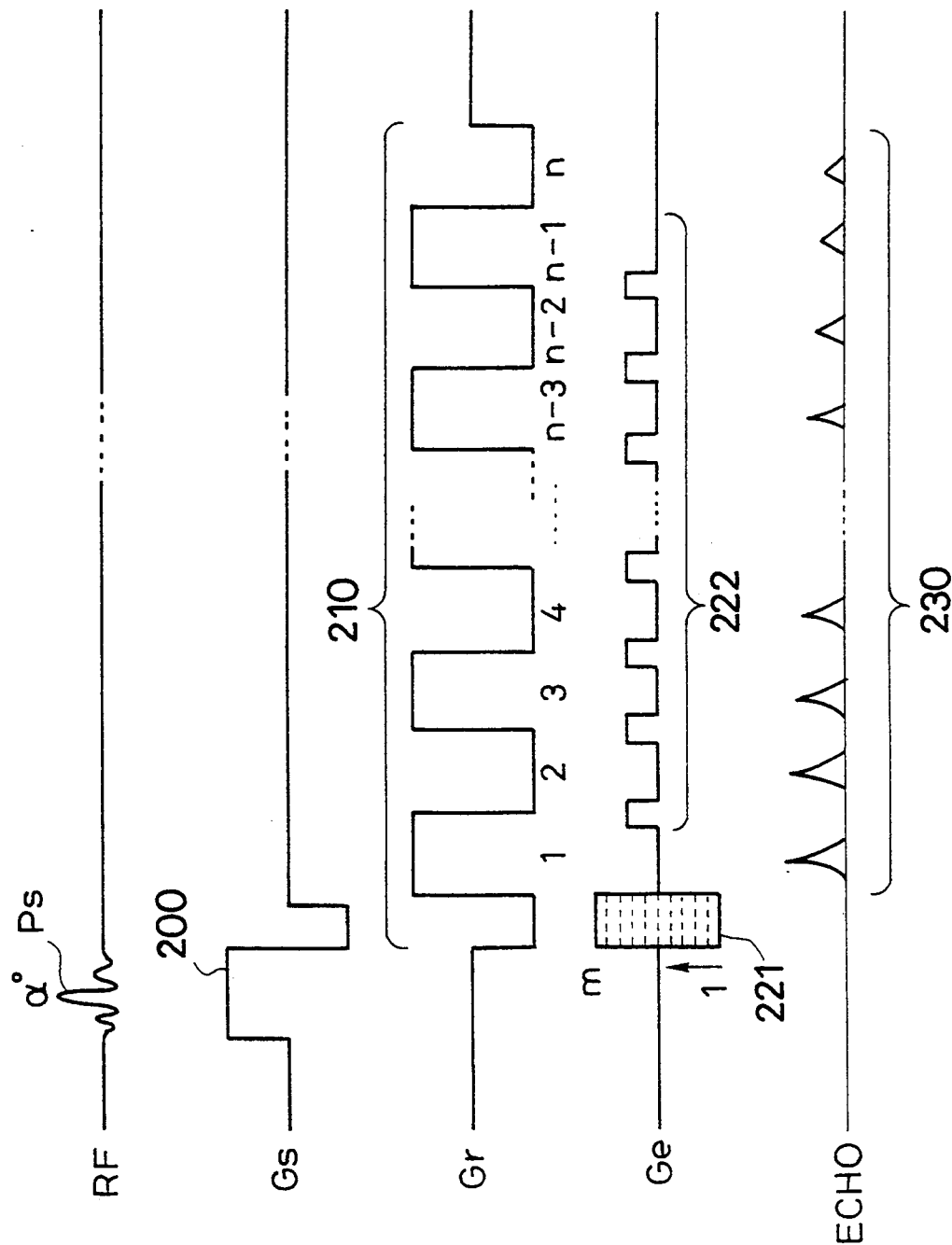
FIG. 8 is a timing chart for the pulse sequence according to the third embodiment of the method of magnetic resonance imaging according to the present invention.

Referring now to FIG. 8, the pulse sequence implementing the third embodiment of the method of magnetic resonance imaging according to the present invention will be described in detail.

In the pulse sequence of FIG. 8, first the α° pulse P5 for flipping the nuclear spins by the predetermined flip angle α° is applied from the probe 9, while the slicing gradient magnetic field 200 is applied by the gradient coils 5.

Then, the m-step initial phase encoding gradient magnetic field 221 is applied from the gradient coils 5 and the reading gradient magnetic field 210 which is regularly fluctuating between positive value and negative value for n times is applied by the gradient coils 5, while at the same time the pulse shaped phase encoding gradient magnetic field 222 is applied during the switching intervals in response to the application of the reading gradient magnetic field 210, so as to collect the FID echo signal data sequence given by the echo signals 230.

Figure 9:
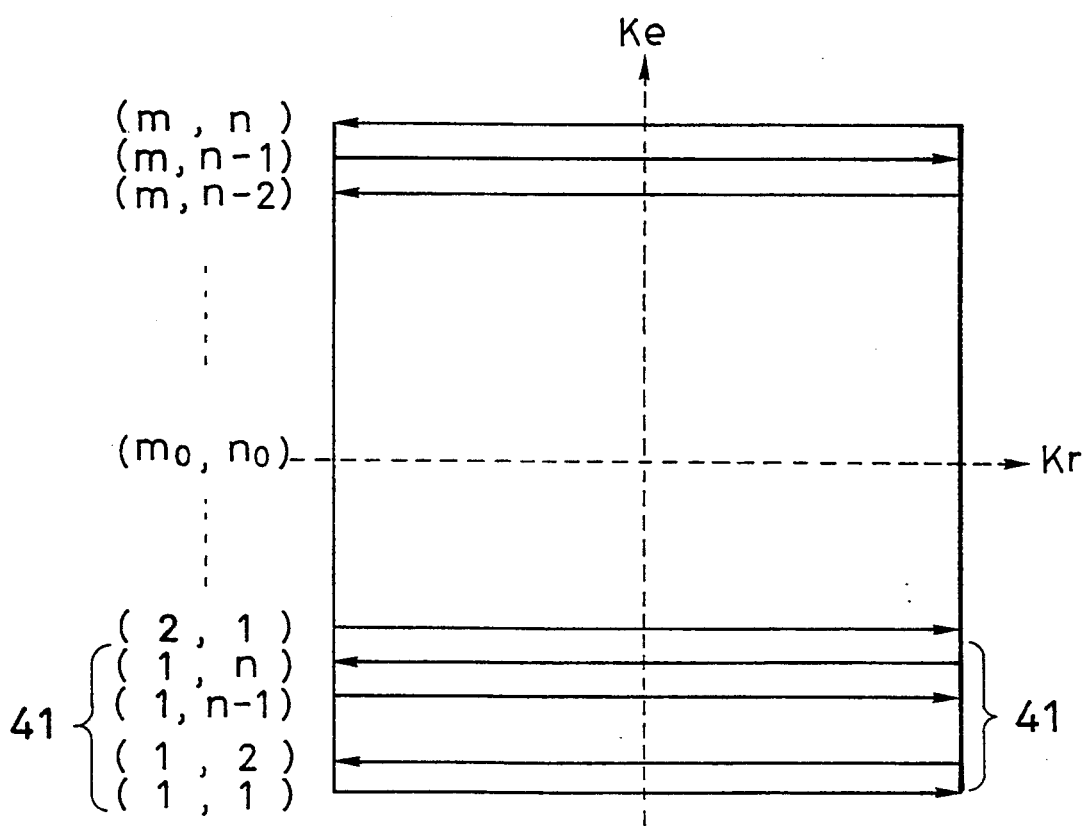
FIG. 9 is a diagram of the k-space trajectory for indicating an order of data acquisition in the third embodiment using the pulse sequence of FIG. 8.

With the process up to this point, the data "For the first region 41 in the k-space shown in FIG. 9 can be collected.

Then, after an elapse of a predetermined period of time, a process similar to that described above for obtaining the data for the first region 41 in the k-space is repeated.

In this third embodiment, the entire pulse sequence of FIG. 8 is repeated for m times, with the values oil the initial phase encoding gradient magnetic field 221 for obtaining each echo signal data sequence sequentially changed among m different settings, so as to obtain the data for the subsequent regions in the k-space.

After all the data in all the regions in the k-space are obtained, the desired MR image can be obtained by rearranging the data in the k-space according to the data acquisition pattern specified by the initial phase encoding gradient magnetic field 221 and applying the inverse 2D Fourier transformation to the rearranged data.

In this third embodiment, the k-space is divided into a plurality of regions and the data are collected for each of the regions in the k-space separately, so that the image quality of the obtained MR image such as the spatial resolution and the S/N ratio can be improved, as the echo signals having less dissipation are used in obtaining the data for each of the regions in the k-space, just as in the first embodiment described above.

It is to be noted that, in this third embodiment, the dispersion of the phases of the nuclear spins due to the inhomogeneity of the static magnetic field increases after the application of the $\alpha°$ RF pulse $P_5$ as the time elapses, and this in turn causes the disturbance or the lowering of the resolution in the reconstructed image, so that the image quality of the obtained MR image can be further improved by appropriately adjusting the data acquisition pattern specified by the initial phase encoding gradient magnetic field 221 such that the data obtained immediately after the application of the $\alpha°$ RF pulse $P_5$ are located in a vicinity of the origin on the k-space.

It is also to be noted that the various modifications such as those noted above For the first embodiment are also applicable to this third embodiment.

Figure 10:
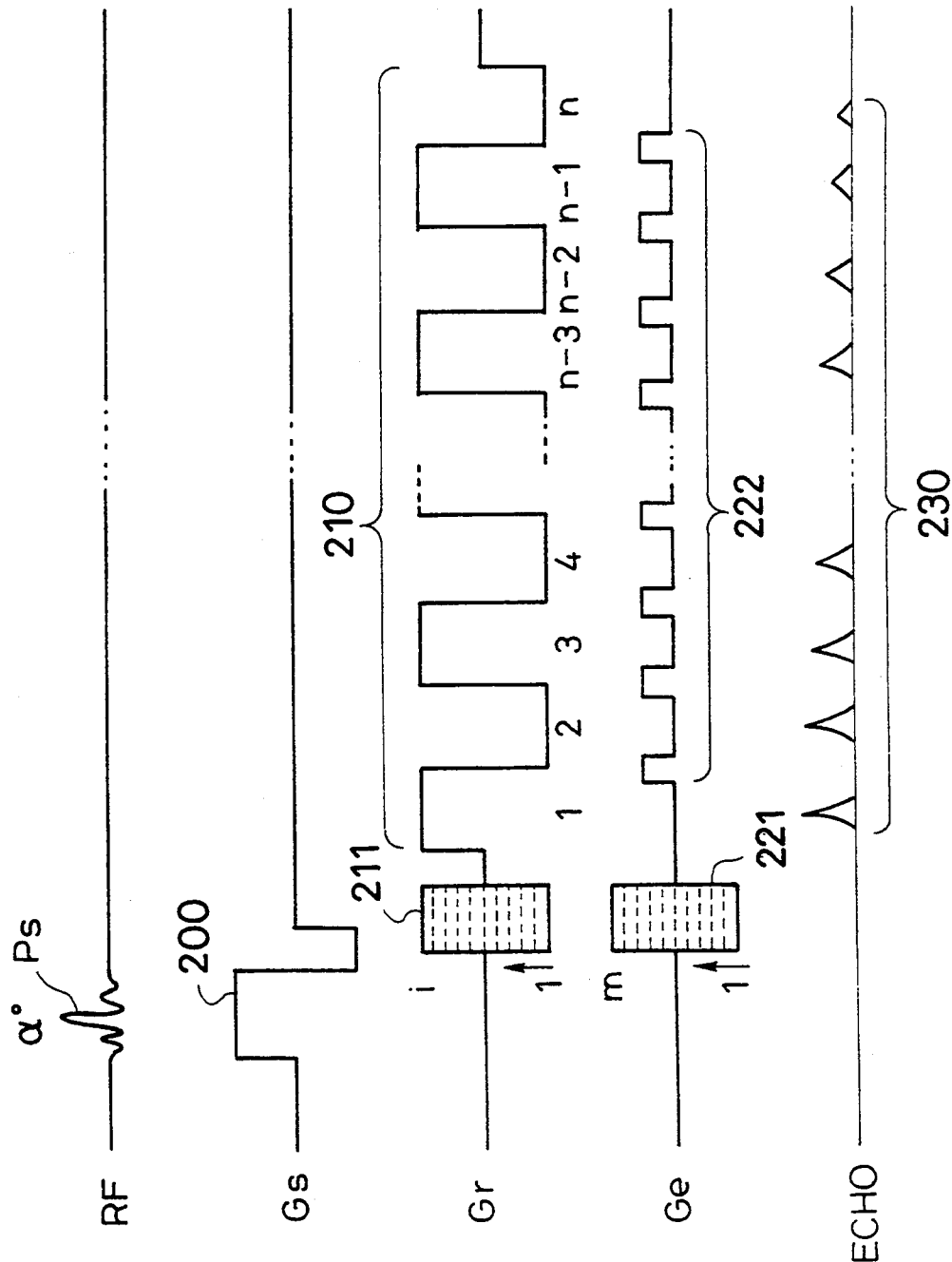
FIG. 10 is a timing chart for the pulse sequence according to the fourth embodiment of the method of magnetic resonance imaging according to the present invention.

Referring now to FIG. 10, the pulse sequence implementing the fourth embodiment of the method of magnetic resonance imaging according to the present invention will be described in detail.

This pulse sequence of FIG. 10 differs from the pulse sequence of FIG. 8 in that, prior to the application of the reading gradient magnetic field 210, i-step off-set reading gradient magnetic field 211 is also applied. The remaining features of this pulse sequence of FIG. 10 are substantially similar to those of FIG. 8.

In this fourth embodiment, the entire pulse sequence of FIG. 10 is repeated for m×i times, with the values of the initial phase encoding gradient magnetic field 221 for obtaining each echo signal data sequence sequentially changed among m different settings, and the values of the off-set reading gradient magnetic field 211 for obtaining each echo signal data sequence sequentially changed among i different settings, so as to obtain the data for the subsequent regions in the k-space.

Figure 11:
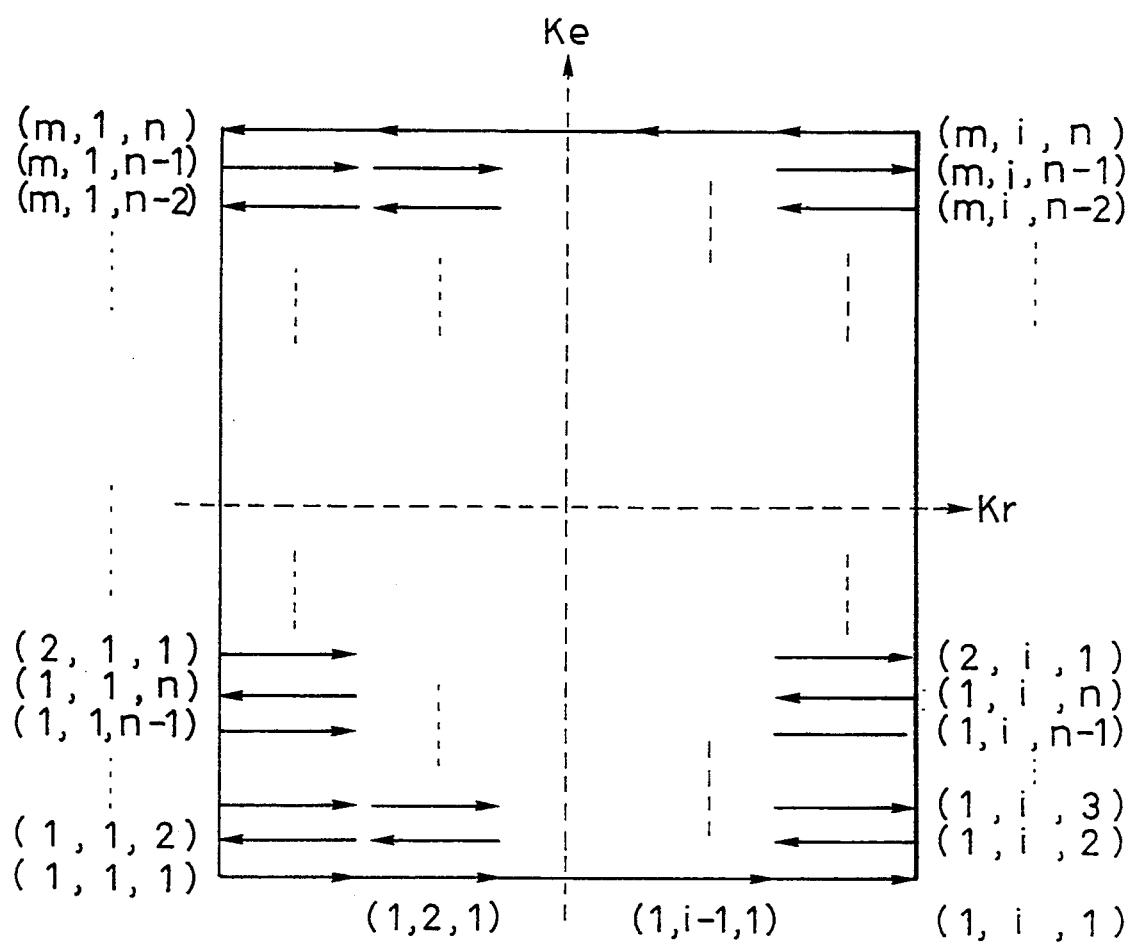
FIG. 11 is a diagram of the k-space trajectory for indicating an order of data acquisition in the fourth embodiment using the pulse sequence of FIG. 10.

With such an incorporation of the off-set reading gradient magnetic field 211, the data acquisition using this pulse sequence of FIG. 10 proceeds in units of blocks in both the encoding and reading gradient magnetic field directions on the k-space as indicated in FIG. 11.

In this fourth embodiment, the k-space is more finely divided into a plurality of blocks and the data are collected for each of the blocks in the k-space separately, so that the image quality of the obtained MR image such as the spatial resolution and the S/N ratio can be even more improved compared with the third embodiment descri above, as the echo signals having even less dissipation are used in obtaining the data for each of the blocks in the k-space.

Moreover, just as in the third embodiment described above, the dispersion of the phases of the nuclear spins due to the inhomogeneity of the static magnetic field increases after the application of the $\alpha°$ RF pulse $P_5$ as the time elapses, and this in turn causes the disturbance or the lowering of the resolution in the reconstructed image, so that the image quality of the obtained MR image can be further improved by appropriately adjusting the data acquisition pattern specified by the initial phase encoding gradient magnetic field 221 such that the data obtained immediately after the application of the $\alpha°$ RF pulse $P_5$ are located in a vicinity of the origin on the k-space.

It is also to be noted that the various modifications such as those noted above for the first embodiment are also applicable to this fourth embodiment.

Figure 12:
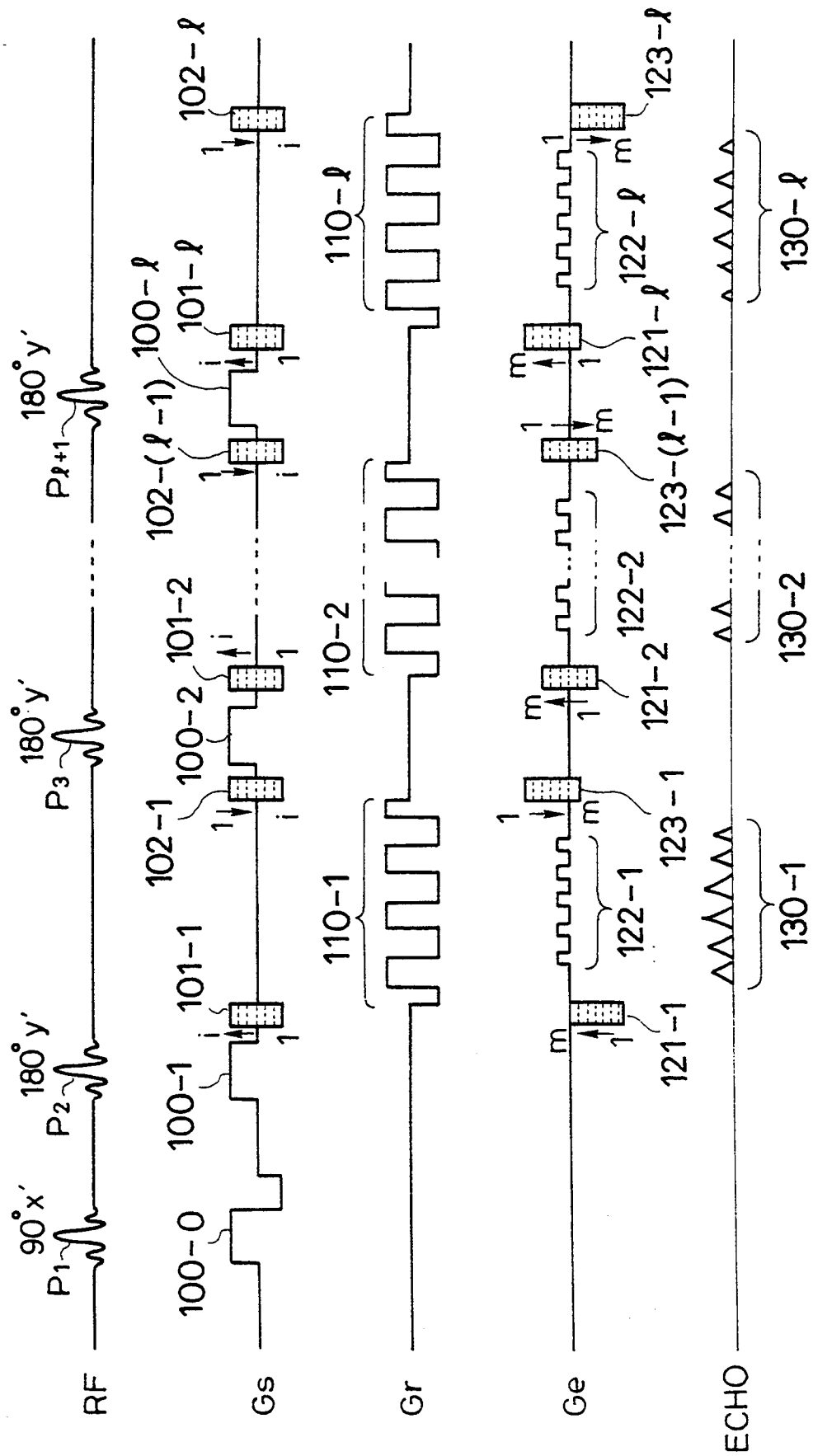
FIG. 12 is a timing chart for the pulse sequence according to the fifth embodiment of the method of magnetic resonance imaging according to the present invention.

Referring now to FIG. 12, the pulse sequence implementing the fifth embodiment of the method of magnetic resonance imaging according to the present invention will be described in detail.

This pulse sequence of FIG. 12 differs from the pulse sequence of FIG. 2 in that, in the process of obtaining the data, immediately after the application of the slicing gradient magnetic field 100, i-step off-set slice phase encoding gradient magnetic field 101 is also applied, and immediately before the next application of the slicing gradient magnetic field 100, i-step phase off-set rewinding gradient magnetic field 102 is also applied. The remaining features of this pulse sequence of FIG. 12 are substantially similar to those of FIG. 2.

In this fifth embodiment, the entire pulse sequence of FIG. 12 is repeated for m×i times, with the values of the initial phase encoding gradient magnetic field 121 and the corresponding rewinding phase encoding gradient magnetic field 123 for obtaining each of the first to l-th echo signal data sequence sequentially changed among m different settings, and the values of the off-set slice phase encoding gradient magnetic field 101 and the corresponding phase off-set rewinding gradient magnetic field 102 for obtaining each of the first to l-th echo signal data sequence sequentially changed among i different settings, so as to obtain the data for the subsequent regions in the k-space.

With such an incorporation of the off-set slice phase encoding gradient magnetic field 101 and the corresponding phase off-set rewinding gradient magnetic field 102, it becomes possible in this fifth embodiment to carry out the data acquisition in three dimensions, so that it can be used in the high-speed three-dimensional imaging.

It is to be noted that the various modifications such as those noted above for the first embodiment are also applicable to this fifth embodiment.

Figure 13A:
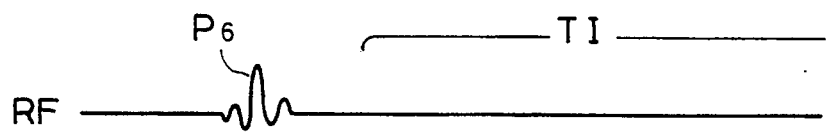
FIGS. 13A and 13B are timing charts of two possible pre-pulse sequences that can be used in the sixth embodiment of the method of magnetic resonance imaging according to the present invention.
Figure 13B:
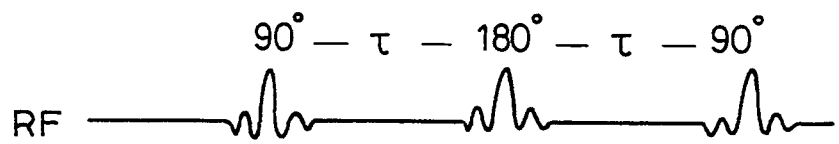

Referring now to FIGS. 13A and 13B, the pulse sequence implementing the sixth embodiment of the method of magnetic; resonance imaging according to the present invention will be described in detail.

In this sixth embodiment, the execution of any one the pulse sequences of the first to fifth embodiments described above is preceded by the execution of a pre-pulse sequence for obtaining the image having a desired contrast, such as the pre-pulse sequences shown in FIG. 13A and FIG. 13B.

The pre-pulse sequence shown in FIG. 13A is obtaining the T1 enhanced image, and comprises a 180° inversion pulse $P_6$ for invertedly exciting the nuclear spins, followed by the predetermined interval period TI.

The pre-pulse sequence shown in FIG. 13B is for obtaining the T2 enhanced image, and comprises a sequence of $90°-\tau-180°-\pi-90°$ pulses.

It is to be noted that any other known pre-pulse sequence for obtaining the image having a special contrast may be used instead of the pre-pulse sequences of FIGS. 13A and 13B, according to the need.

It is also to be noted that the various modifications such as those noted above for the first embodiment are also applicable to this sixth embodiment.

Figure 14:
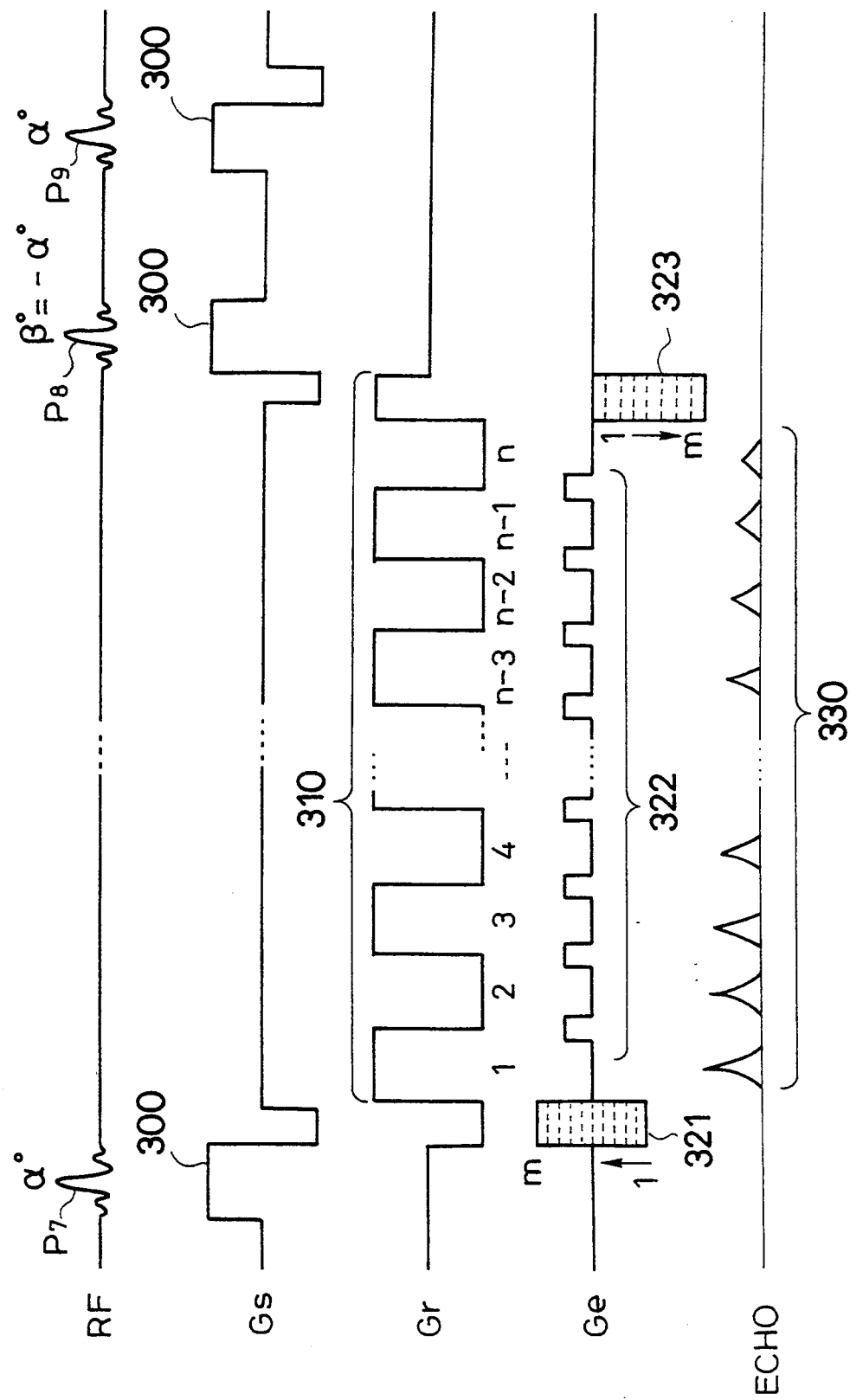
FIG. 14 is a timing chart for the pulse sequence according to the seventh embodiment of the method of magnetic resonance imaging according to the present invention.

Referring now to FIG. 14, the pulse sequence implementing the seventh embodiment of the method of magnetic resonance imaging according to the present invention will be described in detail.

In the pulse sequence of FIG. 14, first the $\alpha°$ RF pulse $P_7$ for flipping the nuclear spins by the predetermined flip angle $\alpha°$ is applied from the probe 9, while the slicing gradient magnetic field 300 is applied by the gradient coils 5.

Then, the m-step initial phase encoding gradient magnetic field 321 is applied from the gradient coils 5, and the reading gradient magnetic field 310 which is regularly fluctuating between positive value and negative value for n times is applied by the gradient coils 5, while at the same time the pulse shaped phase encoding gradient magnetic field 322 is applied during the switching intervals in response to the application of the reading gradient magnetic field 310, so as to collect the FID echo signal data sequence given by the echo signals 330.

After the FID echo signal data sequence is collected, the rewinding phase encoding gradient magnetic field 323 for making the integrated value of the phase encoding gradient magnetic field equal to zero or a predetermined constant value is applied, so as to rewind the phases of the gradient magnetic fields to the initial state.

Then, the $\beta°$ RF pulse $P_8$ applied before the next RF pulse $P_9$ for the next data acquisition process is carried out, where $\beta = -\alpha$ such that the transverse magnetization components of the nuclear spins are forcefully changed into the longitudinal magnetization components.

In this seventh embodiment, the entire pulse sequence of FIG. 14 is repeated for m times, with the values of the initial phase encoding gradient magnetic field 321 and the corresponding rewinding phase encoding gradient magnetic field 323 for obtaining each echo signal data sequence sequentially changed among m different settings, so as to obtain the data for the subsequent regions in the k-space.

Consequently, according to this seventh embodiment, the repetition of the pulse sequence can be carried out more quickly without waiting for the entire longitudinal relaxation time T1 during which the recovery of the longitudinal magnetization components can be made naturally.

It is to be noted that the various modifications such as those noted above for the first embodiment are also applicable to this seventh embodiment.

Now, in order to properly reconstruct the MR images from the NMR data obtained by using any one of the pulse sequences of the first to seventh embodiments described above, the following correction processings are required at a time of the image reconstruction.

Namely, as the pre-processing, it is necessary to collect the echo signal data sequence without using the phase encoding gradient magnetic field Ge as well as the off-set slice phase encoding gradient magnetic field and the off-set reading gradient magnetic field if any of these are to be used, to determine the peak position of the echo signals and the amplitude at the peak position of the echo signals as the reference data. Then, any one or all of the data order, amplitudes, and phases of the echo signals data should be corrected according to the obtained reference data on the echo signals.

Here, the data sequence to be used in determining the reference data may be collected either from the imaging target of the body to be examined 7 or from the appropriate phantom.

As for the post-processing, it is necessary to measure the homogeneity of the static magnetic field on the imaging target of the body to be examined 7, and to make the appropriate correction of the influence due to the inhomogeneity of the static magnetic field such as the distortion of the image.

In addition, in a case the the imaging target of the body to be examined 7 is made of a material which possesses a plurality of nuclear magnetic resonance frequencies due to the chemical shift, it is necessary to apply some prepulse sequence for chemical shift suppression by saturating the nuclear spins which could causes the nuclear magnetic resonance at the frequency other than the intended nuclear magnetic resonance frequency, prior to the execution of the pulse sequence for obtaining the NMR data. There are several known examples of such a pre-pulse sequence for chemical shift suppression including: CHESS scheme (see, A. Hasse et al. "1H-NMR Chemical Shift Selective (CHESS) Imaging", Physics in Medicine and Biology, Vol. 30, pp. 341–344, (1985)), 1-1 pulse scheme (see, C. L. Dumoulin. "A Method for Chemical-Shift-Selective Imaging", Magnetic Resonance in Medicine, Vol. 2, pp. 583–585 (1985)), and 1-3-3-1 pulse scheme (see, P. J. Hore, "A New Method for Water Suppression in the Proton NMR Spectra of Aqueous Solutions", Journal of Magnetic Resonance, Vol. 54, pp. 539–542 (1983)).

It is to be noted that, besides those already mentioned above, many modifications and variations of the above embodiments may be made without departing from the novel and advantageous features of the present invention. Accordingly, all such modifications and variations are intended to be included within the scope of the appended claims.

What is claimed is:

1. A method of magnetic resonance imaging, comprising the steps of:
   (a) placing an object to be examined in a static magnetic field;
   (b) carrying out a pulse sequence, including:
      (b1) applying RF pulses and a slicing gradient magnetic field for exciting a desired imaging region in the object to be examined;
      (b2) applying a reading gradient magnetic field which regularly fluctuates between a negative value and a positive value onto the object to be examined;
      (b3) applying an initial phase encoding gradient magnetic field for specifying a partial region in a k-space onto the object to be examined before the reading gradient magnetic field is applied in step (b2);
      (b4) applying a predetermined pulse shaped phase encoding gradient magnetic field onto the object to be examined, every time the reading gradient magnetic field changes polarity;

(b5) collecting echo signals for the partial region in the k-space emitted from the desired imaging region, every time the reading gradient magnetic field changes polarity;

(c) repeating the pulse sequence of step (b) a plurality of times while sequentially changing a setting of the initial phase encoding gradient magnetic field applied in step (b3), such that the echo signals are collected for an entire region of the k-space; and (d) reconstructing MR images from the echo signals for the entire region of the k-space collected in step (b5) by a repeated application of the pulse sequence of step (b).

2. The method of claim 1 wherein the step (b1) of the pulse sequence of the step (b) further includes:

(b1-1) applying 90° RF pulse and the slicing gradient magnetic field for exciting the desired imaging region in the body to be examined; and (b1-2) applying 180° RF pulse and the slicing gradient magnetic field for producing echoes;

and wherein the pulse sequence at the step (b) further includes the step of repeating the steps (b1-2) and (b2) to (b5) for a plurality of times, with the setting of the initial phase encoding gradient magnetic field applied at the step (b3) being different in each repetition of the step (b3).

3. The method of claim 1, wherein the pulse sequence at the step (b) further includes:

(b6) applying rewinding phase encoding gradient magnetic field for making an integrated value of the phase encoding gradient magnetic field applied to the body to be examined to be a predetermined constant value, after the echo signals are collected at the step (b5), before the pulse sequence of the step (b) is repeated for next time.

4. The method of claim 1, wherein the pulse sequence at the step (b) further includes:

(b7) applying off-set reading gradient magnetic field for dividing the partial region in the k-space into a plurality of parts along a reading gradient magnetic field direction of the k-space, to the body to be examined before the reading gradient magnetic field is applied at the step (b3); and (b8) applying off-set cancelling gradient magnetic field for cancelling the off-set reading gradient magnetic field applied at the step (b7), after the echo signals are collected at the step (b5), before the pulse sequence of the step (b) is repeated for next time.

5. The method of claim 1, wherein the pulse sequence at the step (b) further includes:

(b9) applying off-set slice phase encoding gradient magnetic field for off-setting the k-space in a slicing gradient magnetic field direction, to the body to be examined before the reading gradient magnetic field is applied at the step (b3); and (b10) applying phase off-set rewinding gradient magnetic field for cancelling the off-set slice phase encoding gradient magnetic field applied at the step (b9), after the echo signals are collected at the step (b5), before the pulse sequence of the step (b) is repeated for next time.

6. The method of claim 1, wherein at the step (b1), the RE pulses are applied according to one of CPMG (Carr-Purcell-Meiboom-Gill) scheme and modified CP (Cart-Purcell) scheme.

7. The method of claim 1, wherein at the step (b1), the RF pulses applied are for flipping target nuclear spins in the desired imaging region by a predetermined flip angle.

8. The method of claim 7, wherein the pulse sequence at the step (b) further includes:

(b11) applying a cancelling RF pulses for flipping the target nuclear spins in the desired imaging region by a negative of the predetermined flip angle, after the echo signals are collected at the step (b5).

9. The method of claim 1, wherein the pulse sequence at the step (b) further includes:

(b12) applying one of a pre-pulse sequence for enhancing a contrast for a longitudinal relaxation time of target nuclear spins in the desired imaging region, a prepulse sequence for enhancing a contrast for a transverse relaxation time of target nuclear spins in the desired imaging region, and a pre-pulse sequence for suppressing chemical shift artifacts.

10. The method of claim 1, wherein at the step (d), the echo signals are rearranged according to a data acquisition pattern determined by the initial phase encoding gradient magnetic field applied at the step (b3).

11. The method of claim 10, wherein at the step (b5), the echo signals are collected according to the data acquisition pattern in which the echo signals for which one of a longitudinal relaxation time and a transverse relaxation time of target nuclear spins in the desired imaging region has a predetermined length are collected in a vicinity of an origin of the k-space.

12. The method of claim 10, wherein at the step (b5), the echo signals are collected according to the data acquisition pattern in which the echo signals which are least influenced by inhomogeneity of the static magnetic field are collected in a vicinity of an origin of the k-space.

13. The method of claim 1, wherein at the step (d), at least one of data order, amplitudes and phases of the echo signals collected at the step (b5) is corrected according to a peak position and an amplitude at the peak position of the echo signals obtained without using the initial and pulse shaped phase encoding gradient magnetic fields, before the MR images are reconstructed.

14. The method of claim 1, wherein at the step (d), the MR images reconstructed are corrected according to an inhomogeneity of the static magnetic field in the desired imaging region.

15. An apparatus for magnetic resonance imaging, comprising:

means for producing a static magnetic field in which a body to be examined is to be place;

pulse sequence execution means for carrying out a pulse sequence, including:

first means for applying RF pulses and a slicing gradient magnetic field for exciting a desired imaging region in the body to be examined;

second means for applying a reading gradient magnetic field which regularly fluctuates between a negative value and a positive value onto the body to be examined;

third means for applying initial phase encoding gradient magnetic field for specifying a partial region in a k-space, onto the body to be examined before the reading gradient magnetic field is applied by the second means, and applying a predetermined pulse shaped phase encoding gradient magnetic field onto the body to be examined, every time the reading gradient magnetic field changes polarity;

data acquisition means for collecting echo signals for the partial region in the k-space emitted from the desired imaging region, every time the reading gradient magnetic field changes polarity;

control means for controlling the pulse sequence execution means to repeat the pulse sequence by the first, second, and third means and the data acquisition means a plurality of times, while sequentially changing a setting of the initial phase encoding gradient magnetic field applied by the third means, such that the echo signals are collected for an entire region of the k-space; and image reconstruction means for reconstructing MR images from the echo signals for the entire region of the k-space collected by the data acquisition means by a repeated application of the pulse sequence by the pulse sequence execution means.

16. The apparatus of claim 15, wherein the first means applies: 90° RF pulse and the slicing gradient magnetic field for exciting the desired imaging region in the body to be examined; and 180° RF pulse and the slicing gradient magnetic field for producing echoes; and wherein the pulse sequence execution means repeats the application of the 180° RF pulse and the slicing gradient magnetic field by the first means and subsequent operations of the second, third, and data aquisition means, for a plurality off times, with the setting of the initial phase encoding gradient magnetic field applied by the third means being different in each repetition.

17. The apparatus of claim 15, wherein the pulse sequence execution means further includes:
means for applying rewinding phase encoding gradient magnetic field for making an integrated value of the phase encoding gradient magnetic field applied to the body to be examined to be a predetermined constant value, after the echo signals are collected by the data acquisition means, before the pulse sequence by the pulse sequence execution means is repeated for next time.

18. The apparatus of claim 15, wherein the pulse sequence execution means further includes:
off-set means for applying off-set reading gradient magnetic field for dividing the partial region in the k-space into a plurality of parts along a reading gradient magnetic field direction of the k-space, to the body to be examined before the reading gradient magnetic field is applied by the second means; and
means for applying off-set cancelling gradient magnetic field for cancelling the off-set reading gradient magnetic field applied by the off-set means, after the echo signals are collected by the data acquisition means, before the pulse sequence by the pulse sequence execution means is repeated for next time.

19. The apparatus of claim 15, wherein the pulse sequence execution means further includes:
off-set means for applying off-set slice phase encoding gradient magnetic field for off-setting the k-space in a slicing gradient magnetic field direction, to the body to be examined before the reading gradient magnetic field is applied by the second means; and means for applying phase off-set rewinding gradient magnetic field for cancelling the off-set slice phase encoding gradient magnetic field applied by the off-set means, after the echo signals are collected by the data acquisition means, before the pulse sequence by the pulse sequence execution means is repeated for next time.

20. The apparatus of claim 1S, wherein the first means applies the RF pulses according to one of CPMG (Carr-Purcell-Meiboom-Gill) scheme and modified CP (Cart-Purcell) scheme.

21. The apparatus of claim 15, wherein the first means applies the RF pulses for flipping target nuclear spins the desired imaging region by a predetermined Flip angle.

22. The apparatus of claim 21, wherein the pulse sequence execution means further includes:
means for applying a cancelling RF pulses for flipping the target nuclear spins in the desired imaging region by a negative of the predetermined flip angle, after the echo signals are collected by the data acquisition means.

23. The apparatus of claim 15, wherein the pulse sequence execution means further includes:
means for applying one of a pre-pulse sequence for enhancing a contrast for a longitudinal relaxation time of target nuclear spins in the desired imaging region, a pre-pulse sequence for enhancing a contrast for a transverse relaxation time of target nuclear spins in the desired imaging region, and a pre-pulse sequence for suppressing chemical shift artifacts.

24. The apparatus of claim 15, wherein the image reconstruction means rearranges the echo signals according to a data acquisition pattern determined by the initial phase encoding gradient magnetic field applied by the third means.

25. The apparatus of claim 24, wherein the data acquisition means collects the echo signals according to the data acquisition pattern in which the echo signals for which one of a longitudinal relaxation time and a transverse relaxation time of target nuclear spins in the desired imaging region has a predetermined length are collected in a vicinity of an origin of the k-space.

26. The apparatus of claim 24, wherein the data acquisition means collects the echo signals according to the data acquisition pattern in which the echo signals which are least influenced by inhomogeneity of the static magnetic field are collected in a vicinity of an origin of the k-space.

27. The apparatus of claim 15, wherein the image reconstruction means corrects at least one of data order, amplitudes and phases of the echo signals collected by the data acquisition means according to a peak position and an amplitude at the peak position of the echo signals obtained without using the initial and pulse shaped phase encoding gradient magnetic fields, before the MR images are reconstructed.

28. The apparatus of claim 15, wherein the image reconstruction means corrects the MR images reconstructed according to an inhomogeneity of the static magnetic field in the desired imaging region.

* * * * *